United States Patent
Seo

(10) Patent No.: US 7,158,423 B2
(45) Date of Patent: Jan. 2, 2007

(54) SEMICONDUCTOR MEMORY DEVICE AND ARRAY INTERNAL POWER VOLTAGE GENERATING METHOD THEREOF

(75) Inventor: Eunsung Seo, Seoul (KR)

(73) Assignee: Samsung 'Electronics Co., Ltd., Suwon-si (KR)

( * ) Notice: Subject to any disclaimer, the term of this patent is extended or adjusted under 35 U.S.C. 154(b) by 30 days.

(21) Appl. No.: 11/158,206

(22) Filed: Jun. 20, 2005

(65) Prior Publication Data

US 2005/0281094 A1    Dec. 22, 2005

(30) Foreign Application Priority Data

Jun. 22, 2004   (KR)  .....................  10-2004-0046774

(51) Int. Cl.
*G11C 5/04* (2006.01)
(52) U.S. Cl. ..................... 365/189.09; 365/230.06; 365/226
(58) Field of Classification Search .......... 365/189.09, 365/189.01, 230.06, 210, 226
See application file for complete search history.

(56) References Cited

U.S. PATENT DOCUMENTS

| | | | |
|---|---|---|---|
| 5,373,477 A | 12/1994 | Sugibayashi | |
| 5,764,580 A | 6/1998 | Suzuki et al. | |
| 5,907,237 A | 5/1999 | Sekimoto | |
| 5,966,337 A | 10/1999 | Lee et al. | |
| 6,111,457 A | 8/2000 | Lim et al. | |
| 6,184,744 B1 | 2/2001 | Morishita | |
| 6,385,119 B1 | 5/2002 | Kobayashi et al. | |
| 6,535,435 B1* | 3/2003 | Tanaka et al. | 365/189.09 |

* cited by examiner

*Primary Examiner*—Gene N. Auduong
(74) *Attorney, Agent, or Firm*—Marger Johnson & McCollom, P.C.

(57) ABSTRACT

Method and apparatus for use with internal array voltage generators in semiconductor memory devices are disclosed. In one described embodiment, an overdriving level control circuit is used to generate an overdriving control signal for an internal array voltage generator driver, just prior to a sensing operation. The overdriving level control circuit uses a cell modeling circuit to estimate, just prior to the sensing operation, a current requirement for the sensing operation, and an amplifier to generate the overdriving control signal in response to the estimated current requirement. Such a design allows the amount of overdrive signal to track process, voltage, and temperature changes, for example, to provide an accurate overdrive that allows the internal array voltage to remain stable. Other embodiments are described and claimed.

32 Claims, 16 Drawing Sheets

SEMICONDUCTOR MEMORY DEVICE AND ARRAY INTERNAL POWER VOLTAGE GENERATING METHOD THEREOF

RELATED APPLICATIONS

This application claims the benefit of priority to Korean Patent Application P2004-46774, filed Jun. 22, 2004, the disclosure of which is incorporated herein by reference.

BACKGROUND OF THE INVENTION

1. Field of the Invention

The present invention relates to dynamic random access memory (DRAM) semiconductor devices and systems, and more particularly to methods and apparatus for generating an internal array voltage.

2. Description of the Related Art

Semiconductor memory devices, such as DRAM devices, require several different voltages for proper operation. One of these voltages is an internal array voltage, different than the voltage of externally supplied power, which is used by the memory cell array sensing circuitry during memory operations.

FIG. 1 shows a portion of a typical prior art semiconductor memory device 100, including a memory cell array 10, a control circuit 20, a standby internal voltage generator 30, and an active internal voltage generator 40. The two voltage generators work together to supply an internal array voltage VINTA to memory cell array 10, from an external power supply maintained at an external voltage VEXT.

Standby internal voltage generator 30 operates in both standby and active modes. A standby driving signal generator 32 within voltage generator 30 generates a first analog control signal scon to a driver 34, which drives VINTA. Standby driving signal generator 32 receives feedback on the level of VINTA, and adjusts scon as needed to keep VINTA at a reference voltage.

Active internal voltage generator 40 only operates in the active mode, in response to a signal act from control circuit 20. When act is enabled, an active driving signal generator 42, with function similar to standby driving signal generator 32, is activated. Once activated, active driving signal generator 42 generates a second analog control signal acon to a second driver 44 within voltage generator 40, which also drives VINTA. The combined driving capability of drivers 34 and 44 is therefore available to supply current during a sensing operation of the active mode.

FIG. 2 contains a timing diagram that illustrates a typical active mode operation of device 100. When an active command signal ACT is received by control circuit 20, an active control signal act is asserted. Initially, the internal array voltage VINTA may be slightly overdriven above its steady state voltage level A as active internal voltage generator 40 is activated.

Shortly after asserting act, control circuit 20 asserts a sense amplifier enable signal SEN to memory cell array 10, causing memory cell array 10 to initiate a sensing operation. The sensing operation requires numerous bit lines to be charged rapidly to the internal array voltage VINTA. The current consumed during the initial stages of the sensing operation is significant, causing the internal array voltage VINTA to dip to a voltage level B before recovering to its steady-state value A. If the voltage dip during the sensing operation is not controlled and minimized, the memory device may not work correctly.

FIG. 3 shows a portion of a second prior art semiconductor memory device 200, which attempts to overcome the voltage dip problem of memory device 100 by the addition of an overdriving circuit 50. A control circuit 20' operates similar to control circuit 20, but also supplies an overdriving control signal Pact to the overdriving circuit 50. When overdriving circuit 50 receives Pact, it produces an overdriving signal acon' to second driver 44.

Referring to the timing diagram shown in FIG. 4, Pact is briefly pulsed prior to the activation of sense amplifier enable signal SEN to memory cell array 10. During this pulse, overdriving circuit 50 forces driver 44 to overdrive VINTA to a voltage C when the external voltage VEXT maintains an appropriate voltage level. Voltage C is designed to be just high enough that during the high-current portion of the sensing operation the internal array voltage VINTA, which is controlled during the sensing operation in conventional fashion by standby and active driving signal generators 32 and 42, will drop back to A, and not below A as in FIG. 2. However, when the external voltage (VEXT) is set to too high of a voltage level, the internal array voltage VINTA may be overdriven to a voltage level D. In this case, the voltage level D will drop back to E after the high-current portion of the sensing operation, causing the memory device to not work correctly.

SUMMARY OF THE INVENTION

Several problems have now been recognized with the generation of an internal array voltage in accordance with FIGS. 3 and 4. First, as shown in FIG. 4, when the overdrive voltage is poorly estimated, for instance to level D, the current consumed during the sensing operation may not be sufficient to drop the internal array voltage back to the desired level A. The internal array voltage remains at an elevated voltage E, which can result in unstable device operation. Also, if the overdrive voltage is estimated too low, a situation such as illustrated in FIG. 2 can still occur. Such problems can occur, for example, if the external voltage VEXT is poorly controlled. Also, the control circuit 20' is affected by process, voltage, and temperature (PVT) conditions, which can vary the pulse width of the Pact pulse, causing variations in the overdrive voltage.

The present disclosure describes what is believed to be an internal array voltage generation method, and circuitry, capable of producing a more accurate overdriving signal. In one embodiment, a memory device comprises an overdriving level control circuit having a cell modeling circuit that estimates a charge or current requirement for a sensing operation, and an amplifier to generate a driver control signal in response to the charge or current requirement. Because the cell modeling circuit is generally subjected to the same PVT variations as the actual memory cell array and models the current consumption or charge consumption of the sensing operation, the overdriving level control circuit is believed to provide a more accurate internal array voltage overdrive.

In a further embodiment, a memory device is disclosed that comprises a memory cell array, a plurality of sense amplifiers coupled to the memory cell array to sense data stored in the memory cell array, an internal array voltage generator to supply an internal array voltage to at least the sense amplifiers comprising, a first driver to supply power for use by at least the sense amplifiers during a sensing operation. The memory device also comprises a modeling circuit having a reference capacitor and switched circuitry to change the voltage on the reference capacitor from a first voltage level towards a second voltage level prior to the sensing operation. The modeling circuit outputs a sense modeling signal, related to the changing reference capacitor voltage, to an amplifier. The amplifier supplies an analog control signal based on the sense modeling signal to the first driver to increase the internal array voltage before beginning the sensing operation. The reference capacitor may be, for example, a simple capacitor with switching circuitry to charge it from a bit line pre-charge voltage towards an internal array voltage. In other embodiments, the reference capacitor may take the form of a model memory cell, model bit lines, a model sense amplifier, and other circuitry as appears in the sensing path of a memory cell in the memory cell array.

In another aspect of the disclosure, a method of operating a memory device is disclosed. The method comprises receiving an active mode command to access the memory cell array on the memory device. In response to the active mode command, a modeling circuit is activated on the memory device to estimate a signal proportional to an amount of charge to be consumed during a sensing operation in response to the active mode command. An internal array voltage is overdriven responsive to the estimated signal. Subsequent to initiation of overdriving the internal array voltage, data stored on the memory device is sensed during a sensing operation that draws current from an internal array voltage generator coupled to the internal array voltage.

DETAILED DESCRIPTION OF THE EMBODIMENTS

Figure 5:
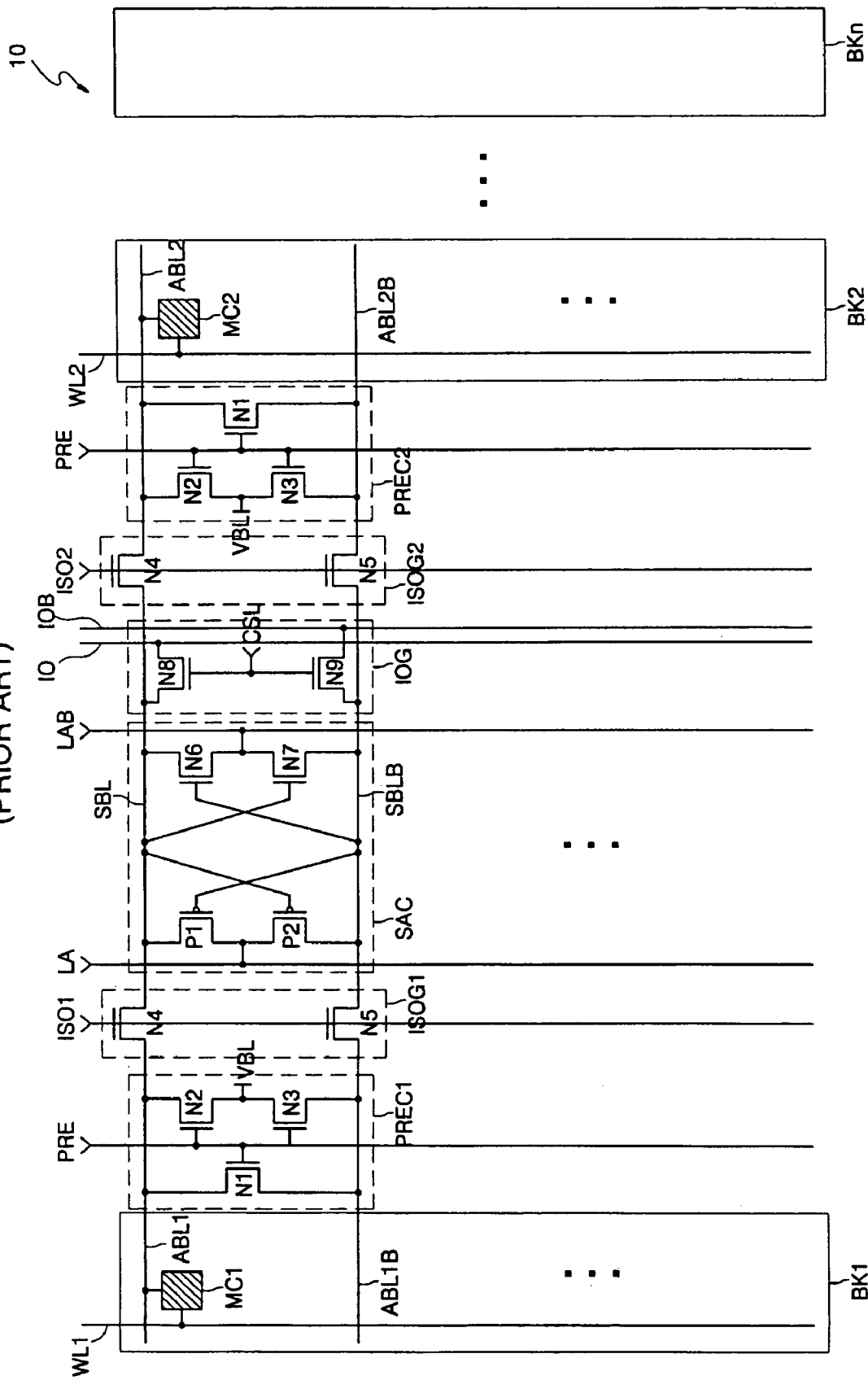
FIG. 5 illustrates prior art circuit details for a section of a memory cell array.
Figure 6:
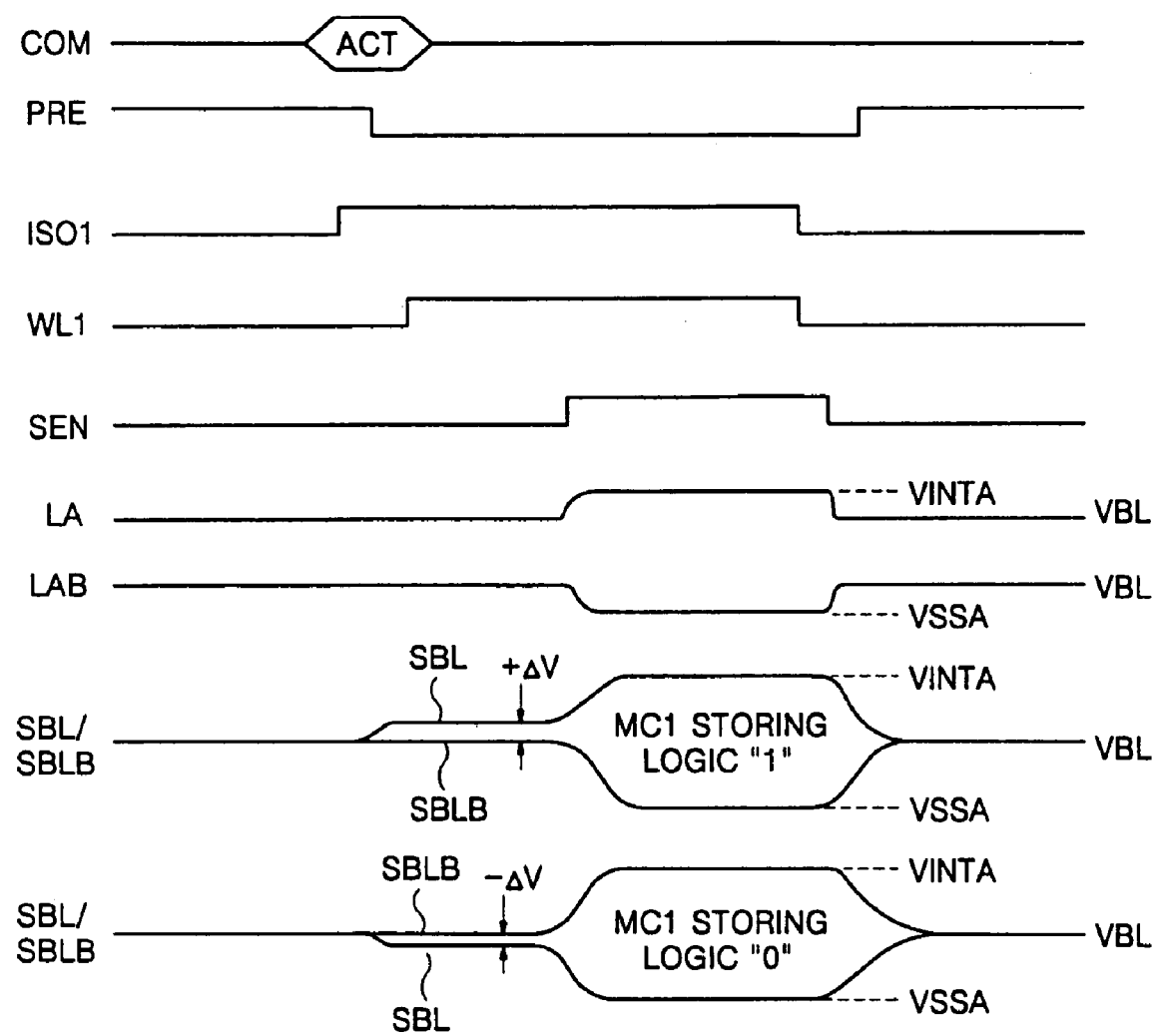
FIG. 6 illustrates timing for a sensing operation in the memory cell array of claim 5.

As an introduction to the embodiments, FIGS. 5 and 6 show respectively, the arrangement of a memory cell array and the timing of a sensing operation. FIG. 5 shows that memory cell array 10 is divided into memory cell array blocks BK1, BK2, . . . , BKn that are repeated across the array. Each memory cell array block comprises a plurality of memory cells, two of which (MC1 and MC2) are shown in blocks BK1 and BK2, respectively. Taking MC1 as exemplary, MC1 is selected and coupled to a bit line ABL1 by a word line select signal on word line WL1. In a memory device that stores one information bit per memory cell, MC1 indicates whether the information bit is a logic "0" or "1", respectively, by the absence or appearance of a charge on a memory cell capacitor.

Although not illustrated, it is understood that multiple memory cells are arranged in block BK1 along the common bit line ABL1, each connectable to ABL1 by application of a word line select signal to a corresponding word line. A reference bit line ABL1B runs parallel to bit line ABL1, but does not connect to the memory cells.

A precharge circuit PREC1 is coupled between bit line ABL and reference bit line ABL1B. The precharge circuit comprises three n-channel MOSFET transistors N1, N2, and N3 controlled by a precharge signal PRE. Precharge signal PRE is activated when no word line select signal is active, to precharge bit lines ABL1 and ABL1B to a bit line voltage VBL, which is a voltage halfway between an internal array voltage VINTA and an internal array ground voltage VSSA. Transistor N1 couples ABL1 and ABL1B together when PRE is activated, equalizing the voltage on each. Transistors N2 and N3 couple ABL1 and ABL1B, respectively, to the bit line voltage VBL when PRE is activated.

A similar arrangement to the block BK1 arrangement exists for block BK2, including a common bit line ABL2, a reference bit line ABL2B, and a second precharge circuit PREC2.

The two blocks BK1 and BK2 share a bit line sense amplifier SAC. To provide better sensing capability, BK1 and BK2 are coupled to sense amplifier SAC through two isolation circuits ISOG1 and ISOG2, respectively. Each isolation circuit comprises two n-channel MOSFET transistors N4 and N5, coupled respectively between a memory cell array bit line and a corresponding sensing bit line and between a memory cell array reference bit line and a corresponding sensing bit line. When the charge stored in a BK1 memory cell is to be sensed, isolation circuit ISOG1 is enabled by a first isolation signal ISO1, while a second isolation signal ISO2 keeps isolation circuit ISOG2 disabled.

Bit line sense amplifier SAC comprises two sensing bit lines SBL and SBLB that are coupled to bit lines ABL1 and ABL1B, respectively, when isolation circuit ISOG1 is enabled. Sense amplifier SAC contains a serial pair of p-channel MOSFET transistors P1 and P2 coupled between SBL and SBLB, with the gate of P1 connected to SBLB and the gate of P2 connected to SBL. A sense amplifier enable signal LA, which is connected to the internal array voltage VINTA during a sensing operation, is coupled between P1 and P2. Sense amplifier SAC also contains a serial pair of n-channel MOSFET transistors N6 and N7 coupled between SBL and SBLB, with the gate of N6 connected to SBLB and the gate of N7 connected to SBL. A complimentary sense amplifier enable signal LAB, which is connected to the internal array ground voltage VSSA during a sensing operation, is coupled between N6 and N7.

A data input/output gate IOG, comprising two n-channel MOSFET transistors N8 and N9, selectively couples sensing bit lines SBL and SBLB, respectively, to two input/output lines IO, IOB, in response to a select signal on a column select line CSL.

The well-known peripheral circuits necessary to generate the various control signals shown in FIG. 5 are not illustrated. Such peripheral circuits generally include a row decoder to select a word line and isolation signals, a column decoder to select a column select line, and other timing/switching components to generate appropriate signals on the other illustrated signal lines. An internal array power distribution subsystem distributes VINTA and VSSA to the appropriate sense amplifiers for each sensing operation.

FIG. 6 illustrates relative timing for a sensing operation that accesses memory cell MC1 in FIG. 5. Prior to the receipt of an active mode command ACT, PRE is active, such that bit lines ABL1 and ABL1B are precharged to VBL. Sensing bit lines SBL and SBLB are also precharged to VBL by setting sense amplifier enable signals LA and LAB to VBL.

Upon receipt of the active mode command ACT, ISO1 is asserted to couple precharged bit lines ABL1 and ABL1B to precharged sensing bit lines SBL and SBLB, and word line WL1 is energized to couple MC1 to bit line ABL1. When MC1 and ABL1 are coupled, the voltage on ABL1 is altered according to a charge-sharing operation between the memory cell MC1 capacitor and the distributed capacitance of the bit line. Thus when the memory cell stores logic "1" as a voltage greater than VBL, the charge sharing operation increases the bit line voltage by an incremental voltage $+\Delta V$. When the memory cell stores logic "0" as a voltage less than VBL, the charge sharing operation decreases the bit line voltage by an incremental voltage $-\Delta V$.

Once the charge-sharing operation has stabilized, bit line sense amplifier SAC is activated by a sensing operation control signal SEN. Control signal SEN causes sense amplifier enable signal LA to supply the internal array voltage VINTA to p-channel transistors P1 and P2, and causes complimentary sense amplifier enable signal LAB to supply the internal array ground voltage VSSA to n-channel transistors N6 and N7. Thus when SEN is activated with SBL slightly more positive than SBLB, transistor P1 presents a lower resistance path to VINTA than transistor P2, and transistor N7 presents a lower resistance path to VSSA than transistor N6, causing the sense amplifier to rapidly drive SBL to VINTA and sink SBLB to VSSA. When SEN is activated with SBL slightly more negative than SBLB, a similar analysis causes a reverse effect, with the sense amplifier rapidly sinking SBL to VSSA and driving SBLB to VINTA.

Whichever way sense amplifier SAC is driven, significant current is drawn from the VINTA voltage generator to charge one of the bit lines from VBL, or VBL $+\Delta V$, to VINTA. In most memory devices, multiple sense amplifiers are operated together, which multiplies the current needs of the memory cell array during a sensing operation. An understanding of these concepts will aid an understanding of the embodiments that will now be presented.

Figure 1:
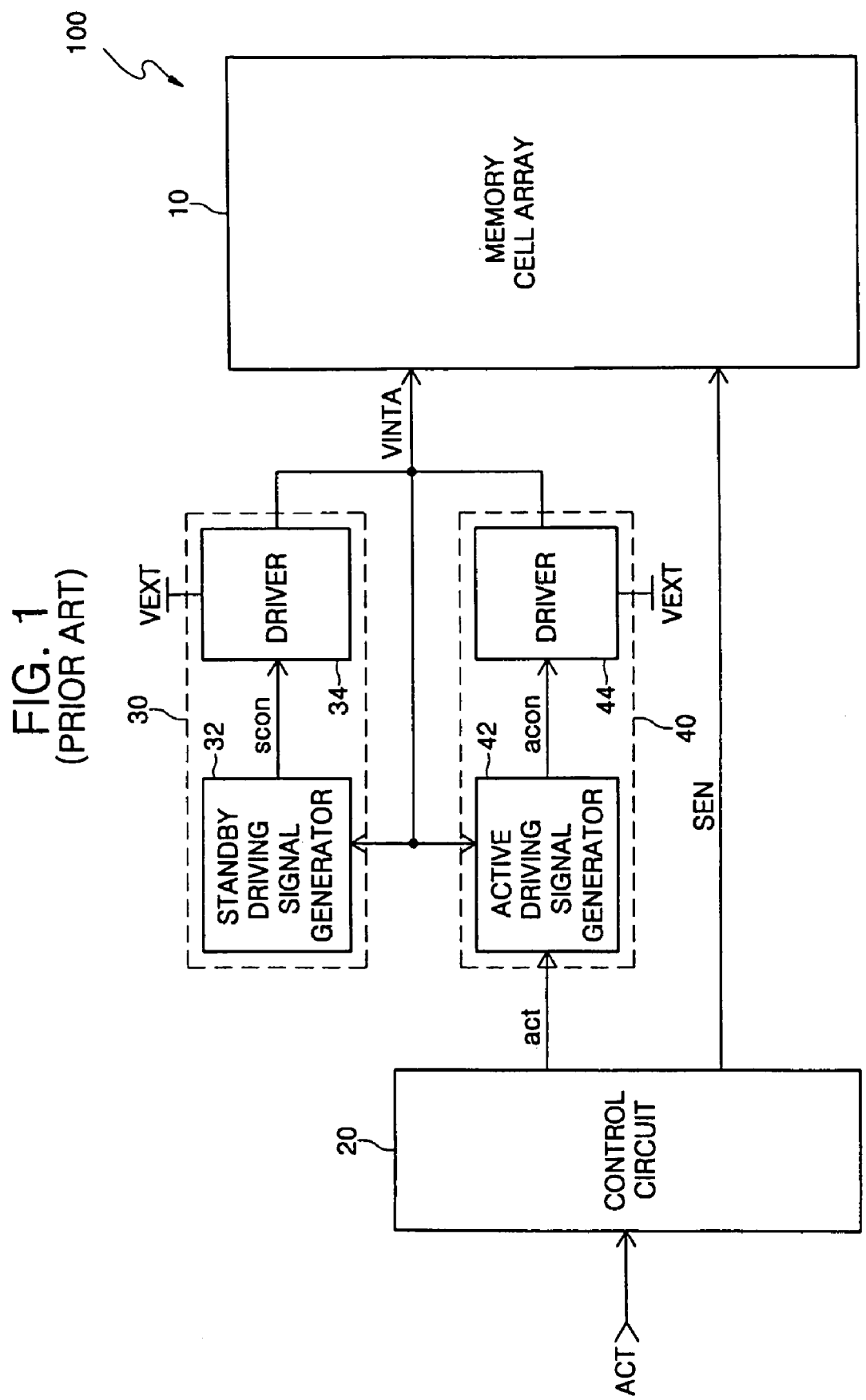
FIG. 1 illustrates some elements of a prior art memory device, including circuitry used to generate an internal array voltage.
Figure 2:
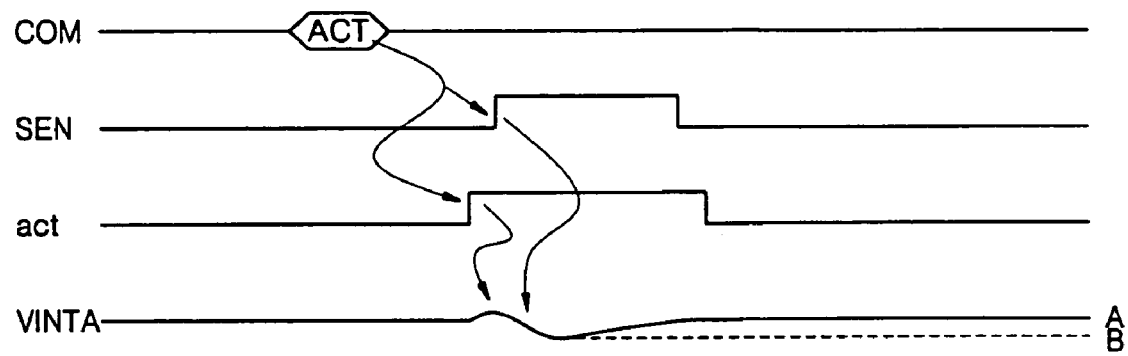
FIG. 2 contains a timing diagram illustrating a prior art method of controlling an internal array voltage with the device of FIG. 1.
Figure 3:
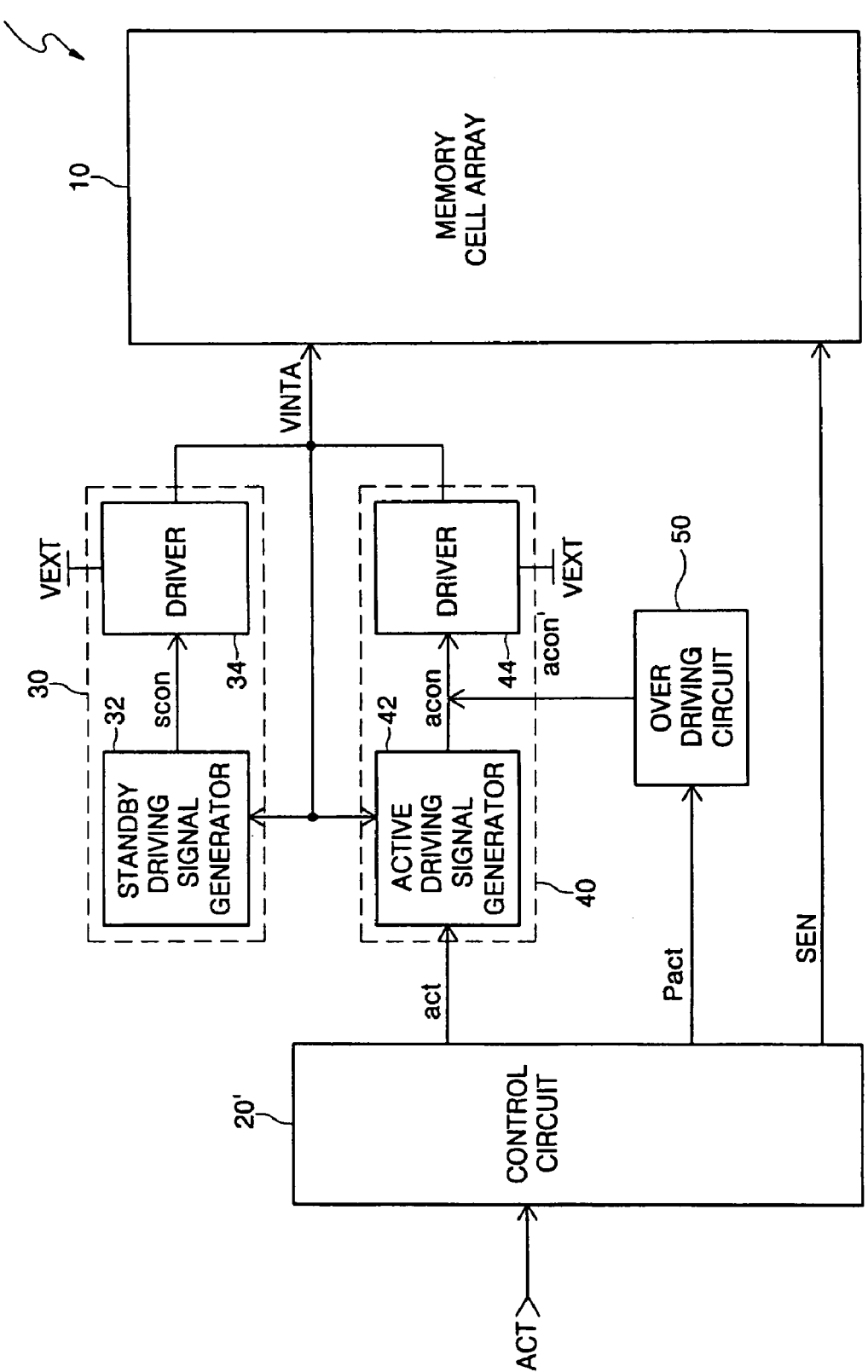
FIG. 3 illustrates some elements of a second prior art memory device, including circuitry used to generate and overdrive an internal array voltage.
Figure 4:
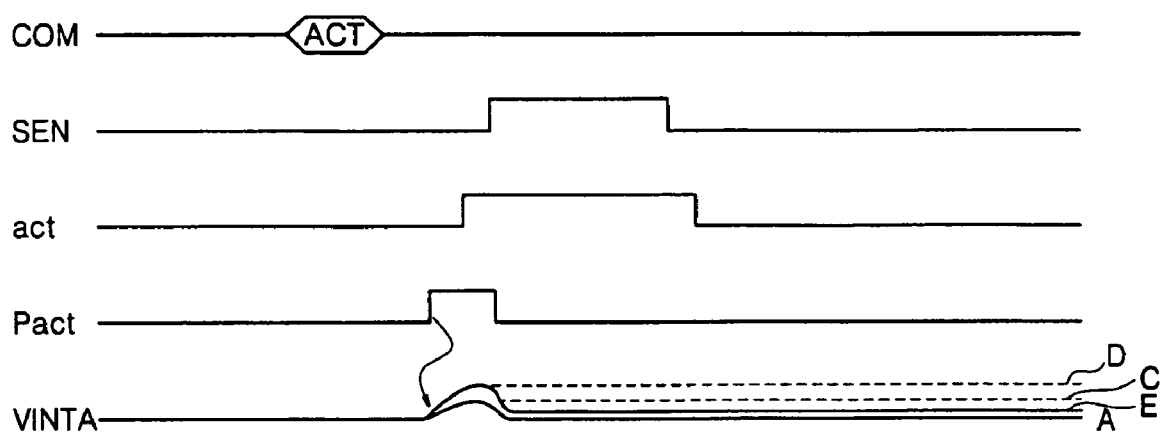
FIG. 4 contains a timing diagram illustrating a prior art method of controlling an internal array voltage with the device of FIG. 3.
Figure 7:
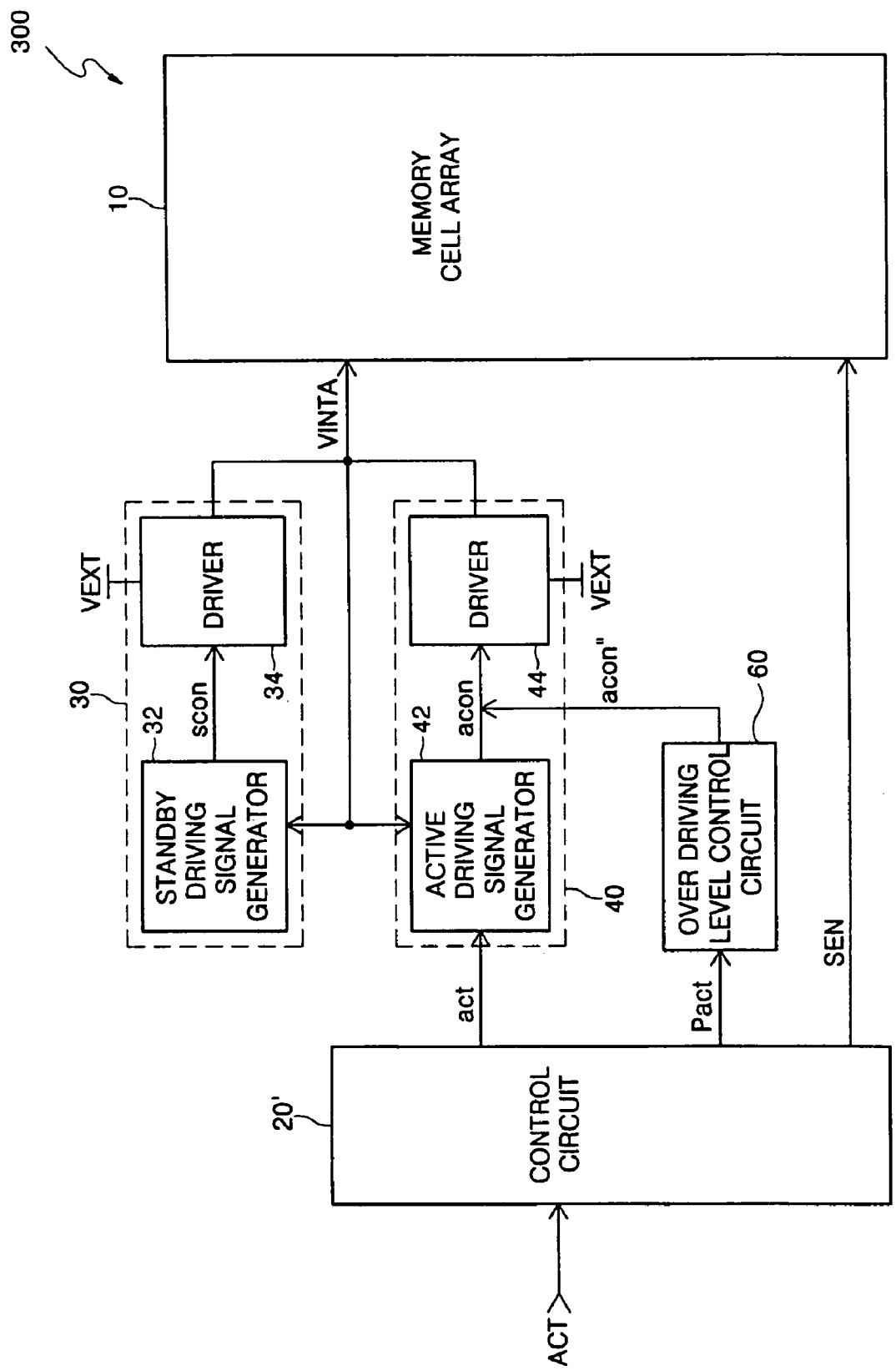
FIG. 7 illustrates some elements of a memory device including circuitry used to generate an internal array voltage and overdrive the level of the internal array voltage.

FIG. 7 illustrates a semiconductor memory device 300, including a memory cell array 10, a control circuit 20', a standby internal voltage generation circuit 30, an active internal voltage generation circuit 40, and an overdriving level control circuit 60. Standby internal voltage generation circuit 30 operates similar to the same circuit in FIGS. 1 and 3 to provide an internal array voltage VINTA to the memory cell array in active and standby modes. Active internal voltage generation circuit 40 operates similar to the same circuit in FIG. 3 to supplement the internal array voltage VINTA generation in an active mode, with the difference that driver 44 receives an analog control signal acon" from overdriving level control circuit 60.

Figure 8:
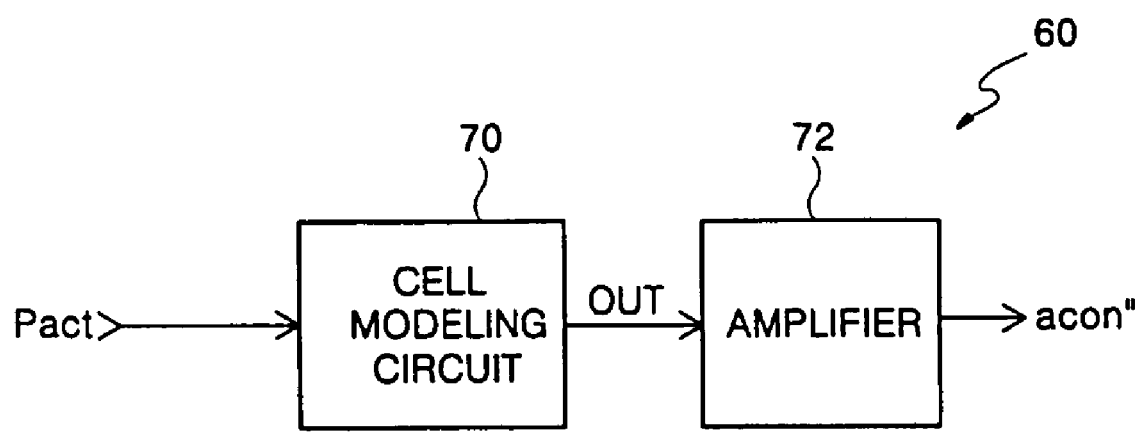
FIG. 8 contains a block diagram for an overdriving level control circuit useful in the FIG. 7 memory device.

Referring now to FIG. 8, overdriving level control circuit 60 comprises a cell modeling circuit 70 and an amplifier 72. Cell modeling circuit 70 receives an overdriving control signal Pact, and generates a signal out that estimates an amount of charge or current to be consumed by the memory cell array during a sensing operation at array internal voltage VINTA. For instance, the signal out may estimate a current or voltage proportional to a rate of charge consumption from VINTA during a sensing operation, or estimate a current or voltage that, when integrated, is proportional to the charge consumed from VINTA during a sensing operation. Amplifier 72 receives the signal out, and amplifies it appropriately to provide analog control signal acon" to a VINTA driver.

Figure 9:
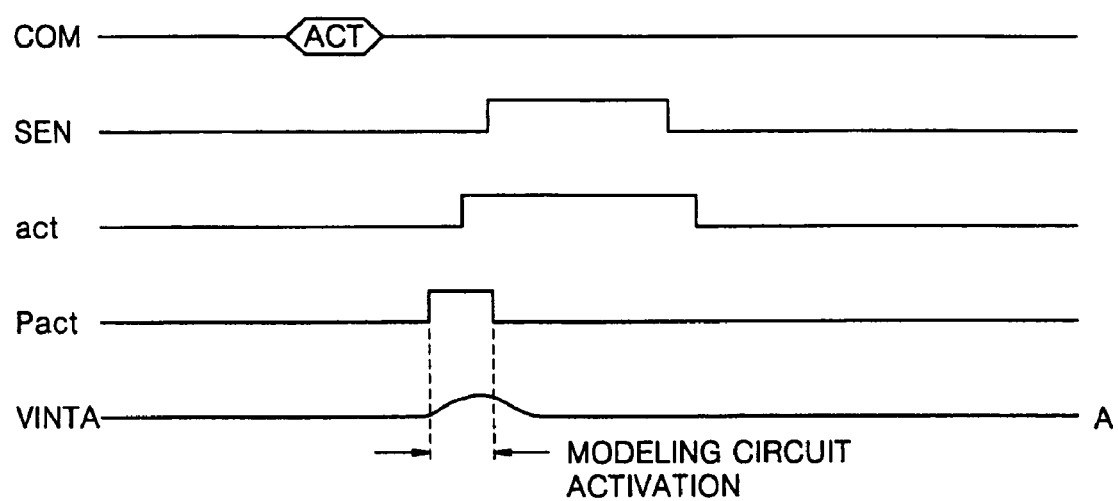
FIG. 9 contains a timing diagram illustrating controlling and overdriving the level of an internal array voltage with the device of FIGS. 7 and 8.

FIG. 9 shows the intended timing of the overdriving level control circuit output for one embodiment. In response to an active mode command ACT, control circuit 20' generates an overdriving control signal Pact to overdriving level control circuit 60. Signal Pact activates the cell modeling circuit 70, which drives amplifier 72, and consequently driver 44, to raise internal array voltage according to the model. Active driving signal generator 42 is enabled by an active control signal act prior to the activation of sensing operation control signal SEN. Overdriving control signal Pact is disabled at approximately the same time that control signal SEN is activated (in various embodiments, Pact can be designed to be disabled shortly before, concurrently with, or shortly after the activation of control signal SEN). With an accurate modeling operation, the excess voltage added to VINTA during the modeling circuit activation is consumed as the memory cell array sense amplifiers draw current to charge bit lines to VINTA, returning VINTA at or near its intended voltage A.

Figure 10:
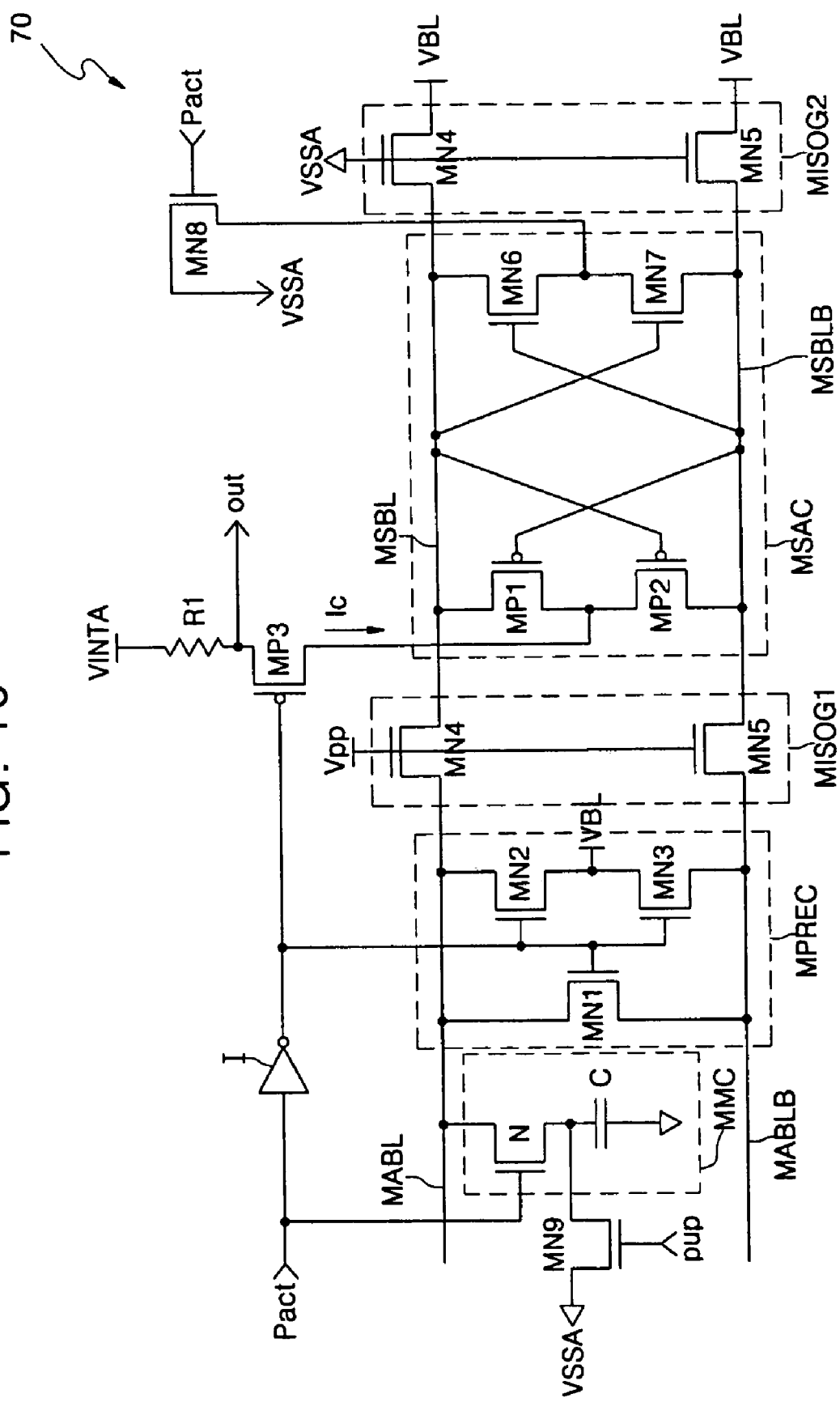
FIGS. 10 and 11 illustrate modeling circuit embodiments modeling a sense amplifier, bit line pair, and memory cell.

Embodiments of cell modeling circuit 70 and amplifier 72 will now be described in detail. A first embodiment of cell modeling circuit 70 is illustrated in FIG. 10.

Modeling circuit 70 comprises, in part, a model memory cell MMC, a model precharge circuit MPREC, two model isolation gates MISOG1 and MISOG2, model array bit lines MABL and MABLB, and a model bit line sense amplifier MSAC. Other circuitry peripheral to these elements is included as well, and will be described as the operation of modeling circuit 70 proceeds.

The model memory cell MMC is similar in some respects to a memory cell in the memory cell array: it comprises a capacitor C that can be coupled to a bit line (MABL) when an n-channel MOSFET pass transistor N is enabled. Pass transistor N is enabled by overdriving control signal Pact, causing a charge sharing operation between capacitor C and bit line MABL.

The overdriving control signal Pact is also supplied to an inverter I, the output of which is supplied as an enable signal to the gates of three n-channel MOSFET transistors MN1, MN2, and MN3 in model precharge circuit MPREC. The three transistors MN1, MN2, and MN3 are configured like the transistors N1, N2, and N3 in FIG. 5, such that except when overdriving control signal Pact is asserted, model precharge circuit MPREC precharges model bit lines MABL and MABLB to bit line precharge voltage VBL.

Model isolation gates MISOG1 and MISOG2 are functionally similar to isolation gates IS01 and IS02 in FIG. 5. Instead of being driven by isolation signals, however, the gates of the pass transistors in model isolation gate MISOG1 are permanently tied to a boosting voltage Vpp which has higher level than that of the external voltage VEXT, such that model isolation gate MISOG1 is permanently enabled. Similarly, the gates of the pass transistors in model isolation gate MISOG2 are permanently tied to the internal array ground voltage VSSA, such that model isolation gate MISOG2 is permanently disabled. Since model isolation gate MISOG2 is permanently disabled, no bit line precharge circuitry or memory cells are provided to the end of MISOG2 opposite the model bit line sense amplifier MSAC. Instead, MISOG2 is simply coupled to the bit line precharge voltage VBL.

As model isolation gate MISOG1 is permanently enabled, model sensing bit lines MSBL and MSBLB in model sense amplifier MSAC are permanently coupled, respectively, to model bit lines MABL and MABLB. Thus the precharging operation on MABL and MABLB also precharges MSBL and MSBLB to the bit line precharge voltage VBL.

Like bit line sense amplifier SAC in FIG. 5, model bit line sense amplifier comprises two p-channel MOSFET transistors (MP1 and MP2) and two n-channel MOSFET transistors (MN6 and MN7) coupled between model sensing bit lines MSBL and MSBLB. When activated, model bit line sense amplifier MSAC thus functions like sense amplifier SAC in FIG. 5 to amplify a voltage difference between MSBL and MSBLB.

Activation of model bit line sense amplifier MSAC occurs in response to overdriving control signal Pact. When Pact is enabled, Pact drives the gate of an n-channel MOSFET transistor MN8 to couple one side of transistors MN6 and MN7 to VSSA. Also when Pact is enabled, the output of inverter I (the logical inverse of overdriving control signal Pact) drives the gate of a p-channel MOSFET transistor MP3 to couple one side of transistors MP1 and MP2 to VINTA.

An additional n-channel MOSFET transistor MN9 can also be included in cell modeling circuit 70. The gate of MN9 is driven by a control signal pup that is momentarily driven to a logic high condition during the device startup sequence. When pup is driven high, MN9 couples capacitor C to internal array ground voltage VSSA, thus draining any charge off of capacitor C. This effectively presets model memory cell MMC to a known logic "0" memory condition.

With the preceding component description, the operation of cell modeling circuit 70 in response to an active mode command ACT can now be described. The assertion of Pact turns off model precharge circuit MPREC and initiates a charge-sharing operation that drains part of the charge on model bit lines MABL and MSBL to capacitor C, lowering the voltage on MSBL below VBL, while model bit lines MABLB and MSBLB remain at VBL. The assertion of Pact also connects MN6 and MN7 to VSSA, causing charge to be drained from MABL, C, and MSBL through MN6 until MABL, C, and MSBL reach VSSA. The assertion of Pact also connects MP1 and MP2 to VINTA, causing charge to be supplied from VINTA through MP2 to MABLB and MSBLB until MABLB and MSBLB reach VINTA.

It should now be noted that a resistor R1 is coupled between VINTA and transistor MP3, such that all charge supplied from VINTA to MABLB and MSBLB during the modeling circuit activation passes through R1 as a charging current. The modeling circuit output signal out is taken at the node joining R1 and MP3. Thus prior to the modeling circuit activation, out is set to a voltage VINTA as no current flows through R1. When modeling circuit 70 is activated, a bit line charging current Ic flows through R1, dropping the voltage at out to VINTA−Ic×R1. Current Ic decreases as bit lines MABLB and MSBLB near VINTA, causing out to rise until eventually out approaches voltage VINTA again.

The layout and size of the model components in cell modeling circuit 70 can be set to match or approximate those used during a sensing operation in the memory cell array. Thus the charging current used during the modeling circuit activation can be designed to represent an estimate of the charging current that will be required in an actual sensing operating that will begin almost immediately after the time of modeling that sensing operation. As the charging current estimate occurs so near in time to the actual sensing operation, on similar circuitry fabricated at the same time on the same circuit, it can be appreciated that process, voltage, and temperature differences that might affect the current required for a sensing operation will affect the modeling circuit similarly, providing increased accuracy in the overdrive of VINTA. Further, the sensitivity to the width of a Pact pulse can be decreased, as most of the charging current estimated during the modeling circuit activation occurs nearer the beginning of the Pact pulse.

Figure 11:
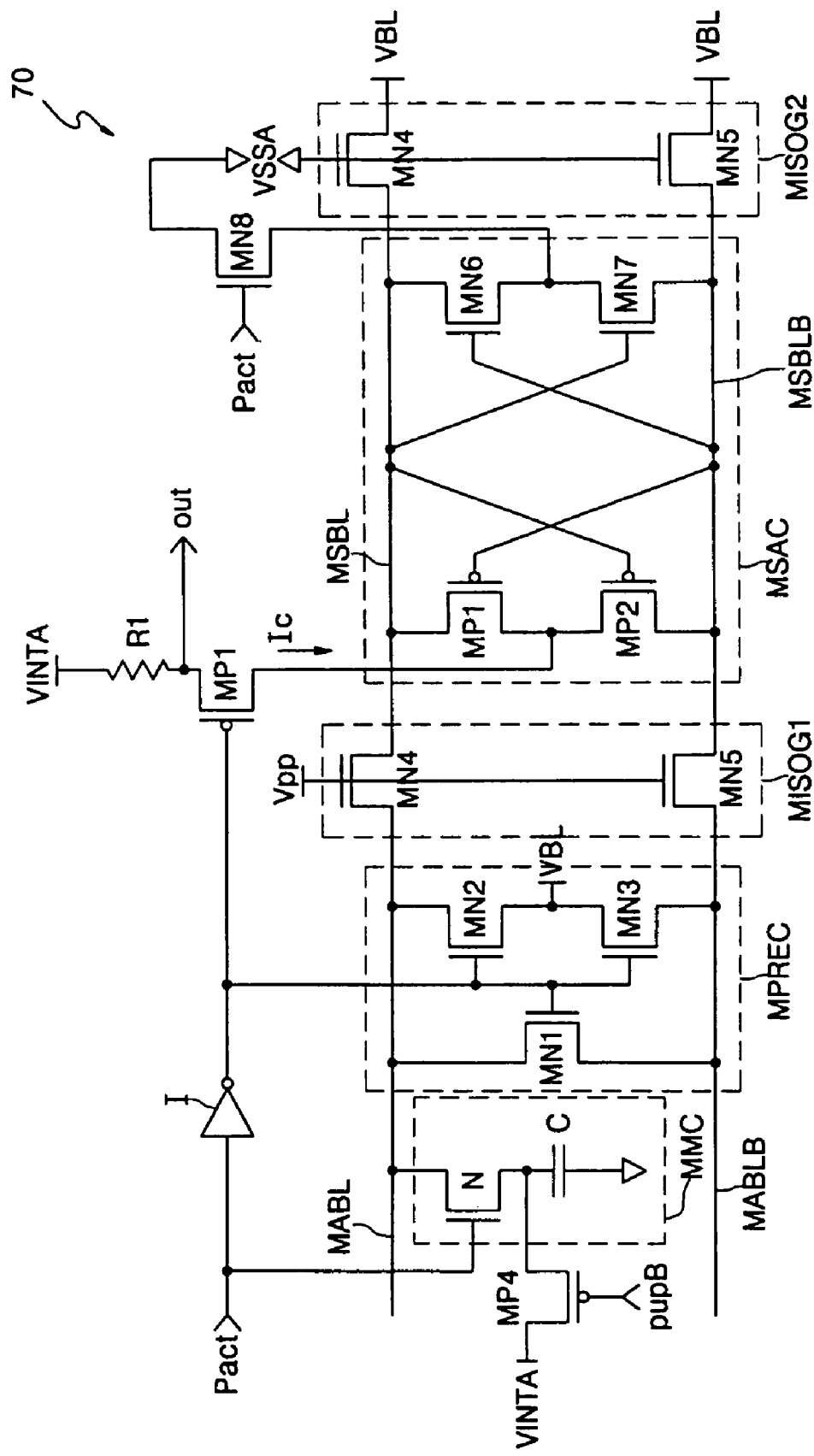

FIG. 11 shows an alternate configuration for cell modeling circuit 70. The MOSFET transistor MP4, which set the state of capacitor C during the device startup sequence, is replaced with a p-channel MOSFET transistor MP4. The gate of MP4 is driven by a control signal pupB that is momentarily driven to a logic low condition during the device startup sequence. When pupB is driven low, MP4 couples capacitor C to internal array voltage VINTA, thus charging capacitor C. This effectively presets model memory cell MMC to a known logic "1" memory condition.

Upon activation of the modeling circuit, the charge-sharing operation between C and model bit lines MABL and MSBL charges model bit lines MABL and MSBL from capacitor C, raising the voltage on MSBL above VBL, while model bit lines MABLB and MSBLB remain at VBL. The assertion of Pact also connects transistors MN6 and MN7 to VSSA, causing charge to be drained from MABLB and MSBLB through transistor MN7 until MABLB and MSBLB reach VSSA. The assertion of Pact also connects transistors MP1 and MP2 to VINTA, causing charge to be supplied from VINTA through transistor MP1 to MABL, C, and MSBL until MABL, C, and MSBL reach VINTA.

When modeling circuit 70 is activated, a bit line charging current Ic flows through R1, dropping the voltage at output node out to VINTA−Ic×R1. Current Ic decreases as bit lines MABL and MSBL and capacitor C near VINTA, until eventually out approaches voltage VINTA again. Note that because the sensing operation beginning voltage on MSBL is slightly higher than the beginning voltage on MSBLB in FIG. 11, and because the model memory cell MMC is charged as well, the modeling circuit output signal out may be slightly different for FIG. 11 embodiment than for the FIG. 10 embodiment.

Figure 12:
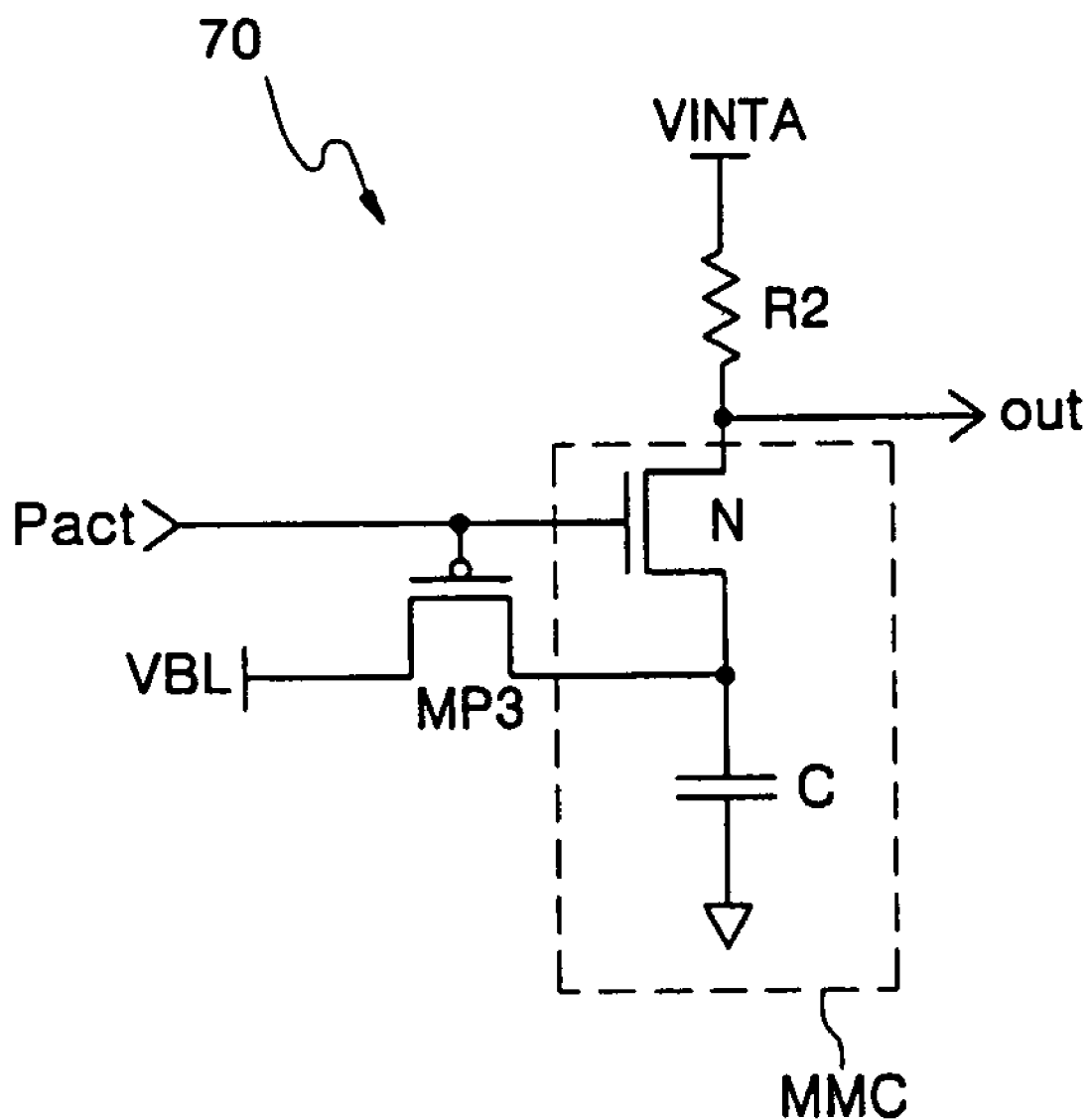
FIG. 12 illustrates a modeling circuit embodiment using a capacitor driven from a bit line precharge voltage toward an internal array voltage.

Although the cell modeling circuit embodiments shown in FIGS. 10 and 11 closely emulate an actual sensing configuration, other modeling circuit embodiments are possible. For instance, FIG. 12 shows a simpler version of a cell modeling circuit 70. A model memory cell MMC comprises a capacitor C coupled to an n-channel MOSFET pass transistor N, which connects in turn through a resistor R2 to internal array voltage VINTA. A cell modeling circuit output signal out is supplied from the node joining resistor R2 and transistor N. A p-channel MOSFET transistor MP3 is also coupled to capacitor C and to the bit line precharge voltage VBL. The overdriving control signal Pact drives the gate of pass transistor N, and also drives the gate of transistor MP3.

Prior to the activation of overdriving control signal Pact, transistor MP3 is active, allowing capacitor C to charge to bit line precharge voltage VBL. When overdriving control signal Pact is activated, transistor MP3 is disabled and transistor N is enabled, allowing C to charge from VBL towards VINTA. Output signal out, like in the preceding example, drops below VINTA as charging current is supplied to capacitor C. Capacitor C and resistor R2 can be selected to achieve a desired output signal profile. Although possibly not as precise a model as that shown in FIGS. 10 and 11, The FIG. 12 modeling circuit will also track PVT variations in similar fashion as the more complex embodiments.

Figure 13:
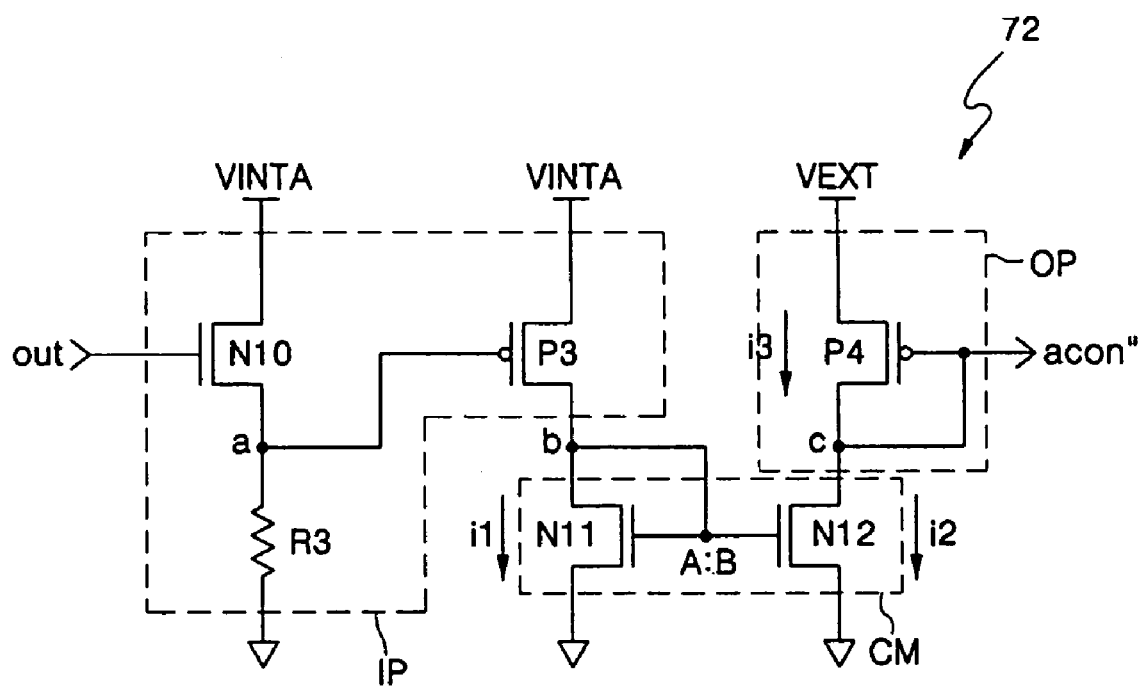
FIG. 13 illustrates an amplifier embodiment useful in the overdriving level control circuit of FIG. 7.

Turning now to FIG. 13, one embodiment for an amplifier 72 that can be paired with an embodiment of cell modeling circuit 70 is depicted. Amplifier 72 comprises an input section IP, a current mirror CM, and an output section OP. Each will be described in turn.

Input section IP comprises an n-channel MOSFET transistor N10, a resistor R3, and a p-channel MOSFET transistor P3. Transistor N10 and resistor R3 are connected in a source follower configuration, with the drain of transistor N10 connected to internal array voltage VINTA, the gate of transistor N10 driven by the modeling circuit output signal out, and the resistor R3 coupled between the source of transistor N10 and internal array ground voltage VSSA. The voltage at node a, where transistor N10 and resistor R3 are coupled, follows the voltage appearing on modeling circuit output signal out. The gate of transistor P3 is coupled to node a, the source of transistor P3 is coupled to VINTA, and the drain of transistor P3 is coupled to an input of current mirror CM at node b.

Current mirror CM comprises two n-channel MOSFET transistors N11 and N12 with a transistor width ratio A:B. Transistor N11 has a drain coupled to current mirror input node b, a source coupled to VSSA, and a gate coupled to current mirror input node b. Transistor N12 has a drain coupled to a current mirror output node c, a source coupled to VSSA, and a gate coupled to current mirror input node b. The width ratio A:B forces the current i2 passing through transistor N12 to relate to the current i1 passing through transistor N11 by a scaling factor B/A.

Output section OP comprises a p-channel MOSFET transistor P4 with a source coupled to an external power voltage VEXT, and a drain and gate coupled to current mirror output node c. The overdriving level control circuit output signal acon" is also taken at node c.

Operation of amplifier 72 is as follows. Prior to the activation of overdriving control signal Pact, out is approximately equal to VINTA, causing the voltage at node a to approach VINTA approximately also. This high voltage at node a turns off transistor P3, cutting off currents i1 and i2 and providing no drive signal at output acon". When overdriving control signal Pact enables the cell modeling circuit, the voltage out at the gate of transistor N10 drops, which drops the voltage of node a in turn. As the voltage of node a drops, P3 turns on and a current i1 begins to flow. Current i1 is mirrored as i2, scaled by a scaling factor B/A. This results in a corresponding voltage drop at node c and a reduced voltage for output acon".

Figure 14:
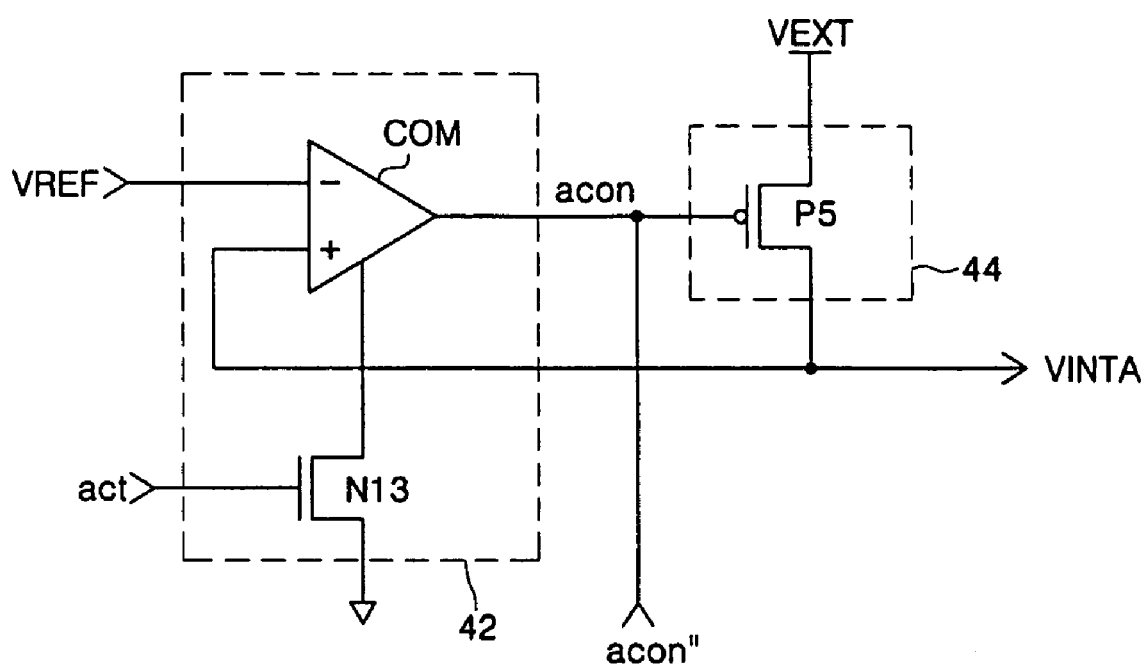
FIG. 14 illustrates an internal voltage generator useful with some embodiments.

FIG. 14 shows one configuration for the active driving signal generator 42 and driver 44 shown in FIG. 7. Active driving signal generator 42 comprises a differential amplifier COM and an n-channel MOSFET transistor N13 having a gate driven by activation signal act. When signal act is generated by control circuit 20', transistor N13 is turned on, turning on amplifier COM in turn. A negative input terminal of amplifier COM is coupled to a reference voltage VREF, and a positive input terminal of amplifier COM is coupled to VINTA. The output of the differential amplifier, acon, drives the gate of a p-channel MOSFET transistor P5 in driver 44. Transistor P5 has a source connected to the external array voltage VEXT and a drain connected to internal array voltage VINTA. This connection completes a feedback loop that causes amplifier COM to attempt to drive acon such that VINTA is equal to VREF.

The control signal acon", from overdriving level control circuit 60, also drives the gate of transistor P5 in driver 44. When Pact is active and act is not active, the feedback loop including amplifier COM is disabled, allowing acon" to drive VINTA above VREF. For instance, as acon" drops in response to the charging current of the modeling circuit, transistor P5 is turned on to a greater degree, allowing additional charging of VINTA above the VREF level. Subsequently, when act is enabled, amplifier COM cannot control the internal array voltage VINTA back to VREF until sufficient charge is consumed in the internal array power distribution subsystem and sense amplifiers to allow the voltage to drop.

Figure 15:
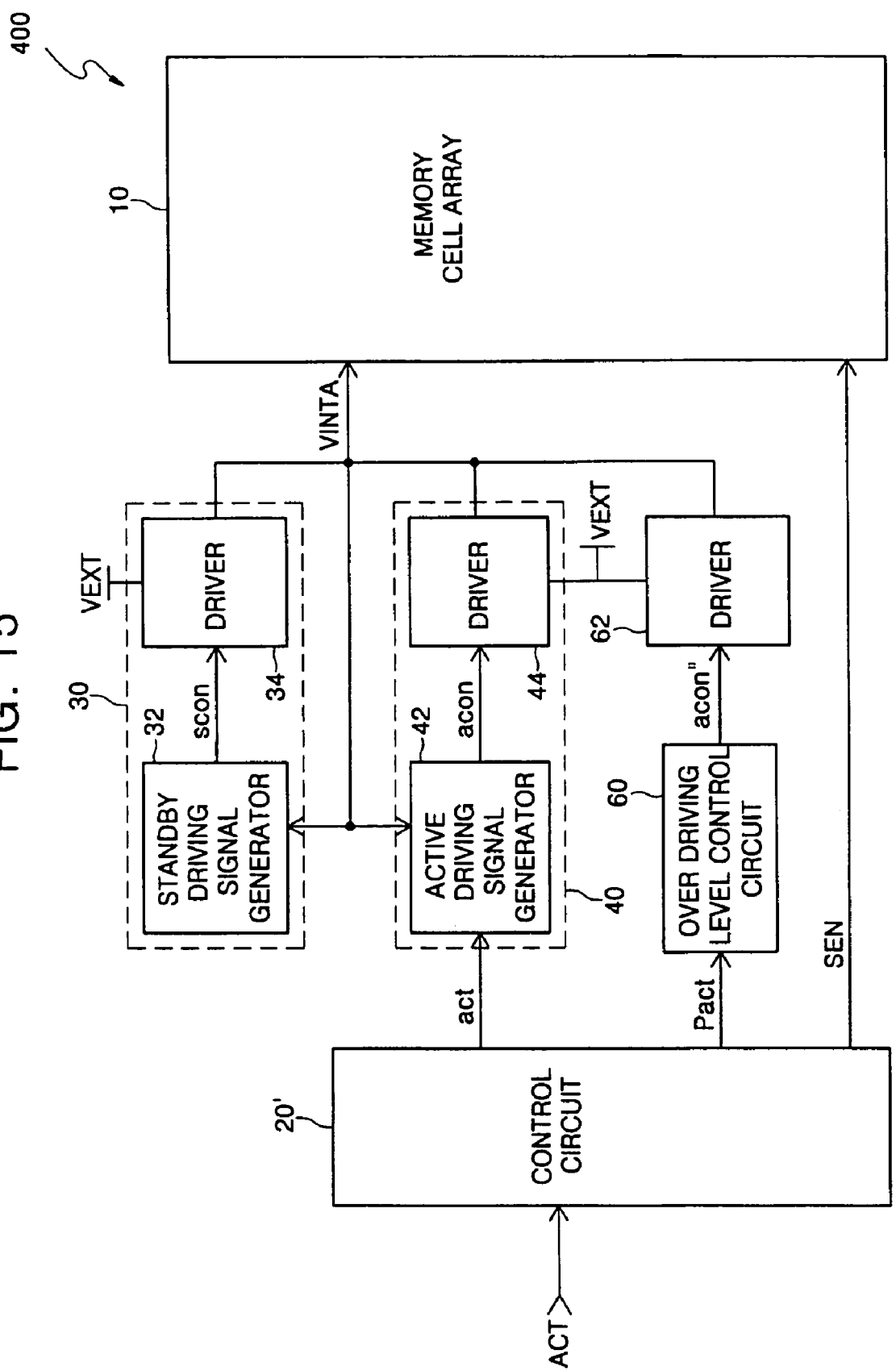
FIG. 15 depicts some elements of a memory device including a separate overdriving driver to overdrive the level of the internal array voltage.

FIG. 15 shows a second semiconductor memory device embodiment 400. Although similar in many respects to embodiment 300 of FIG. 7, several differences are notable. A separate driver 62 is provided for overdriving VINTA. The control signal acon" is no longer provided by the overdriving level control circuit 60 to active mode driver 44, but is supplied instead to the new driver 62. All three drivers 34, 44, and 62 can provide drive current for internal array voltage VINTA, with driver 34 always active, driver 44 active for the duration of an act pulse, and driver 62 active for the duration of a Pact pulse.

Figure 16:
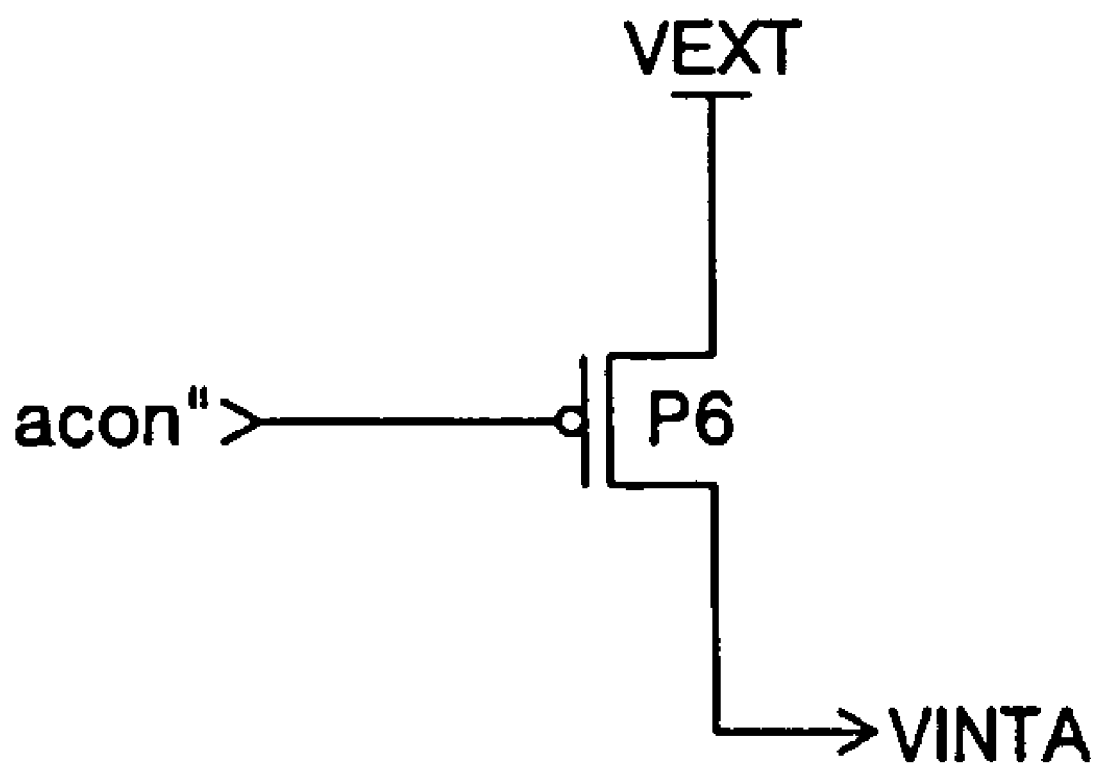
FIG. 16 shows one embodiment of the separate overdriving driver.

FIG. 16 shows one configuration for driver 62. The output of overdriving level control circuit 60, acon", drives the gate of a p-channel MOSFET transistor P6 in driver 62. Transistor P6 has a source connected to the external array voltage VEXT and a drain connected to internal array voltage VINTA. When Pact is active, acon" can drive VINTA above VREF. For instance, as acon" drops in response to the charging current of the modeling circuit, transistor P6 is turned on to a greater degree, allowing additional charging of VINTA above the VREF level.

Those skilled in the art will recognize that many other device configuration permutations can be envisioned and many design parameters have not been discussed. For instance, in the embodiments of FIGS. 10 and 11, a cell modeling circuit output signal could be constructed using circuitry that measures the current drained to VSSA during a sensing operation. The particular current-mode and voltage-mode signals as shown in the embodiments are but one possibility for generating modeling signals. Furthermore, other memory cell array and sensing configurations exist, and may require or be better suited for a different modeling circuit configuration that more accurately models such other configurations. The specific circuits described and shown in the drawings are merely exemplary—in most cases, other circuits can accomplish the same or similar functions. Such minor modifications and implementation details are encompassed within the embodiments of the invention, and are intended to fall within the scope of the claims.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

What is claimed is:

1. A memory device comprising:
   a memory cell array;
   a plurality of sense amplifiers coupled to the memory cell array; and
   an internal array voltage generator to supply the internal array voltage to at least the sense amplifiers, comprising
   a first driver to supply the internal array voltage to at least the sense amplifiers,
   a modeling circuit comprising a reference capacitor and switched circuitry to change the voltage on the reference capacitor from a first voltage level towards a second voltage level prior to a sensing operation, the modeling circuit outputting a sense modeling signal related to the changing reference capacitor voltage, and
   an amplifier to receive the sense modeling signal and to supply a first control signal, based on the sense modeling signal, to the first driver to increase the internal array voltage before beginning the sensing operation.

2. The memory device of claim 1, the internal array voltage generator further comprising an active driving signal generator that supplies a second control signal to the first driver to drive the internal array voltage towards a reference voltage during an active command.

3. The memory device of claim 2, the internal array voltage generator further comprising a standby driving signal generator that supplies a third control signal to a second driver and coupled to the first driver output, the standby driving signal generator driving the steady state value of the internal array voltage towards the reference voltage.

4. The memory device of claim 1, wherein the switched circuitry comprises a precharge circuit to set the reference capacitor voltage to the first voltage level, and a reference coupling circuit to couple the reference capacitor to a reference voltage at the second voltage level.

5. The memory device of claim 4, wherein the first voltage level is a bit line precharge voltage level and the second voltage level is the internal array voltage.

6. The memory device of claim 5, further comprising a control circuit to create an over driving control signal that is enabled prior to the sensing operation, the over driving control signal when enabled enabling the reference coupling circuit.

7. The memory device of claim 6, wherein the reference coupling circuit comprises a resistor and a first transistor, the first transistor coupled between one end of the resistor and one plate of the reference capacitor and having a gate coupled to the over driving control signal, the resistor having its other end coupled to the internal array voltage.

8. The memory device of claim 7, wherein the sense modeling signal is taken at the coupling between the resistor and the first transistor.

9. The memory device of claim 3, wherein the modeling circuit further comprises a model bit line pair, a model sense amplifier coupled to the model bit line pair, a model memory cell coupled to one line of the model bit line pair, a precharge circuit also coupled to the model bit line pair, and a reference coupling circuit coupling to the model sense amplifier.

10. The memory device of claim 9, wherein the model memory cell comprises a model cell capacitor and a model pass transistor to couple the model cell capacitor to the one line of the model bit line pair, the model pass transistor having a gate controlled by an over driving control signal.

11. The memory device of claim 10, further comprising a model memory cell initialization circuit to set an initial state of the model memory cell.

12. The memory device of claim 11, wherein the model memory cell initialization circuit sets the initial state of the model memory cell to a charged state, and wherein the reference capacitor further comprises the model memory cell.

13. The memory device of claim 9, wherein the reference coupling circuit supplies power to the model sense amplifier when the reference coupling circuit is enabled.

14. The memory device of claim 10, the over driving control signal coupled to the precharge circuit such that the precharge circuit is disabled when the reference coupling circuit is enabled in response to the over driving control signal.

15. The memory device of claim 1, wherein the amplifier comprises an input section referenced to the internal array voltage and generating a first current in response to the sense modeling signal, a current mirror to replicate the first current as a second current, and an output section referenced to an external voltage and generating the first control signal in response to the second current.

16. The memory device of claim 15, wherein the input section comprises a source follower.

17. A memory device comprising:
    a memory cell array;
    a plurality of sense amplifiers coupled to the memory cell array to sense data stored in the memory cell array; and
    an internal array voltage generator to supply the internal array voltage to at least the sense amplifiers, comprising
    a standby internal voltage generation circuit comprising a standby driving signal generator to generate a first control signal to a first driver, the standby internal voltage generation circuit driving the steady state value of the internal array voltage towards a reference voltage,
    a control circuit receiving an active mode signal, the control circuit generating an active mode pulse concurrent with a sensing operation of at least one of the sense amplifiers and an overdrive pulse initiated prior to the sensing operation,
    an active internal voltage generation circuit comprising an active driving signal generator to generate a second control signal to a second driver in response to the active mode pulse, the active internal voltage generation circuit driving the steady state value of the internal array voltage towards the reference voltage during the active mode pulse, and
    an overdriving level control circuit to generate a third control signal to the second driver in response to the overdrive pulse, the overdriving level control circuit comprising a cell modeling circuit to estimate a current requirement for the sensing operation and an amplifier to generate the third control signal in response to the estimated current requirement.

18. The memory device of claim 17, wherein the cell modeling circuit estimated current requirement varies with a power supply voltage, temperature variations, and process variations similar to the variation of an actual current requirement for the sensing operation with the power supply voltage, temperature variations, and process variations.

19. The memory device of claim 18, wherein the cell modeling circuit comprises a model memory cell, model bit line pair, and model sense amplifier coupled similar to a selected memory cell in the memory cell array, a bit line pair in the memory cell array, and one of the sense amplifiers coupled to the bit line pair in the memory cell array.

20. A memory device comprising:
a memory cell array;
a plurality of sense amplifiers coupled to the memory cell array to sense data stored in the memory cell array; and
an internal array voltage generator to supply the internal array voltage to at least the sense amplifiers, comprising
a standby internal voltage generation circuit comprising a standby driving signal generator to generate a first control signal to a first driver, the standby internal voltage generation circuit driving the steady state value of the internal array voltage towards a reference voltage,
a control circuit receiving an active mode signal, the control circuit generating an active mode pulse concurrent with a sensing operation of at least one of the sense amplifiers and an overdrive pulse initiated prior to the sensing operation,
an active internal voltage generation circuit comprising an active driving signal generator to generate a second control signal to a second driver in response to the active mode pulse, the active internal voltage generation circuit driving the steady state value of the internal array voltage towards the reference voltage during the active mode pulse, and
an overdriving internal voltage generation circuit comprising an overdriving level control circuit to generate a third control signal to a third driver in response to the overdrive pulse, the overdriving level control circuit comprising a cell modeling circuit to estimate a current requirement for the sensing operation and an amplifier to generate the third control signal in response to the estimated current requirement.

21. The memory device of claim 20, wherein the cell modeling circuit estimated current requirement varies with a power supply voltage, temperature variations, and process variations similar to the variation of an actual current requirement for the sensing operation with the power supply voltage, temperature variations, and process variations.

22. The memory device of claim 20, wherein the cell modeling circuit comprises a model memory cell, model bit line pair, and model sense amplifier coupled similar to a selected memory cell in the memory cell array, a bit line pair in the memory cell array, and one of the sense amplifiers coupled to the bit line pair in the memory cell array.

23. A method of operating a memory device, the method comprising:
receiving an active mode command to access a memory cell array on the memory device;
in response to the active mode command, activating a modeling circuit on the memory device to estimate a signal proportional to an amount of charge to be consumed during a sensing operation in response to the active mode command;
overdriving an internal array voltage in response to the estimated signal; and
subsequent to initiation of overdriving the internal array voltage, sensing data stored on the memory device during a sensing operation that draws current from an internal array voltage generator coupled to the internal array voltage.

24. The method of claim 23, wherein activating a modeling circuit comprises performing a model sensing operation on a model memory cell and model bit line pair, and generating an output signal proportional to the current drawn from the internal array voltage generator to perform the model sensing operation.

25. The method of claim 23, wherein activating a modeling circuit comprises coupling a capacitor charged to a bit line precharge voltage to the internal array voltage to change the voltage on the reference capacitor towards the internal array voltage, and generating an output signal proportional to the current drawn from the internal array voltage generator to perform the model sensing operation.

26. The method of claim 23, wherein the estimated signal is an output signal proportional to the current drawn by the modeling circuit from the internal array voltage generator during the modeling circuit activation, and wherein overdriving an internal array voltage in response to the estimated signal comprises driving the internal array voltage generator with a signal based on the output signal of the modeling circuit and with a second control signal that controls the internal array voltage to a reference voltage.

27. The method of claim 23, wherein the estimated signal is an output signal proportional to the current drawn by the modeling circuit from the internal array voltage generator during the modeling circuit activation, and wherein overdriving an internal array voltage in response to the estimated signal comprises driving an overdriving array voltage generator with a signal based on the output signal of the modeling circuit, the overdriving array voltage generator coupled to the internal array voltage.

28. The method of claim 23, wherein the estimated signal is an output voltage proportional to the current drawn by the modeling circuit from the internal array voltage generator during the modeling circuit activation, the method further comprising generating a first current proportional to the output voltage, mirroring the first current as a second current with a current mirror having an input to output current ratio greater than one, and generating an overdriving control signal based on the second current.

29. The method of claim 23, wherein the modeling circuit is deactivated prior to the sensing operation.

30. The method of claim 23, further comprising controlling the internal array voltage to a reference voltage in a standby mode and in an active mode using a second internal array voltage generator.

31. The method of claim 30, further comprising controlling the internal array voltage to a reference voltage in the active mode using a third internal array voltage generator.

32. The method of claim 30, further comprising controlling the internal array voltage to a reference voltage in the active mode by driving a same internal array voltage generator that is overdriven in response to the estimated signal.

* * * * *